US011037759B2

(12) United States Patent
Kakehi et al.

(10) Patent No.: US 11,037,759 B2
(45) Date of Patent: Jun. 15, 2021

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventors: Ryoichi Kakehi, Yokohama (JP); Osamu Iizuka, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 460 days.

(21) Appl. No.: 16/132,968

(22) Filed: Sep. 17, 2018

(65) Prior Publication Data
US 2019/0103252 A1 Apr. 4, 2019

(30) Foreign Application Priority Data

Sep. 29, 2017 (JP) .............................. JP2017-190882

(51) Int. Cl.
*H01J 37/317* (2006.01)
*H01J 37/304* (2006.01)

(52) U.S. Cl.
CPC ........ *H01J 37/3177* (2013.01); *H01J 37/304* (2013.01); *H01J 2237/24514* (2013.01);
(Continued)

(58) Field of Classification Search
CPC ...... H01J 37/28; H01J 37/304; H01J 37/3174; H01J 37/3177; H01J 2237/30483; H01J 2237/31793; H01J 2237/24514
See application file for complete search history.

(56) References Cited

U.S. PATENT DOCUMENTS

| 9,495,499 | B2 | 11/2016 | Platzgummer et al. |
| 2017/0358425 | A1* | 12/2017 | Iizuka ................ H01J 37/1474 |

FOREIGN PATENT DOCUMENTS

| JP | 7-262953 A | 10/1995 |
| JP | 10-106931 | 4/1998 |

(Continued)

OTHER PUBLICATIONS

Japanese Office Action dated Oct. 27, 2020 in counterpart Japanese Patent Application No. 2017-190882 (with English translation), 8 pages.

(Continued)

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

In one embodiment, a multi charged particle beam writing apparatus includes a stage position detector detecting a position of the stage which holds a substrate to be written, a mark disposed on the stage, a beam position detector detecting a beam position of each beam by allowing the multiple beams to pass over the mark, a beam shape detector detecting a beam shape of the multiple beams at predetermined time intervals based on the detected beam position and the detected position of the stage, the multiple beams being used to irradiate the substrate, and a writing data processor calculating an amount of irradiation correction of each beam for correcting the beam shape based on the detected beam shape.

13 Claims, 8 Drawing Sheets

(52) U.S. Cl.
   CPC ............... *H01J 2237/30483* (2013.01); *H01J 2237/31793* (2013.01)

(56) References Cited

FOREIGN PATENT DOCUMENTS

| | | |
|---|---|---|
| JP | 2003-297732 A | 10/2003 |
| JP | 2004-214435 A | 7/2004 |
| JP | 2004-303794 A | 10/2004 |
| JP | 2006-140267 | 6/2006 |
| JP | 2008-85120 A | 4/2008 |
| JP | 2014-7379 | 1/2014 |
| JP | 2015-179735 A | 10/2015 |
| JP | 2015-228501 | 12/2015 |
| JP | 2016-063149 A | 4/2016 |
| JP | 2016-225357 | 12/2016 |

OTHER PUBLICATIONS

Combined Chinese Office Action and Search Report dated Jun. 1, 2020 in corresponding Chinese Patent Application No. 201811144885.7 (with English Translation and English Translation of Category of Cited Documents), 18 pages.

Office Action dated Jun. 30, 2020 in corresponding Japanese Patent Application No. 2017-190882 (with English Translation), 6 pages.

Office Action dated Oct. 28, 2019 in Korean Patent Application No. 10-2018-0108218, 10 pages. (with unedited computer generated English translation).

\* cited by examiner

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2017-190882, filed on Sep. 29, 2017, the entire contents of which are incorporated herein by reference.

FIELD

The present invention relates to a multi charged particle beam writing apparatus and a multi charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus using multiple beams can provide significantly improved throughput, because it is capable of irradiating with more beams at a time than when writing with a single electron beam. In a multi-beam writing apparatus, for example, an electron beam emitted from an electron gun is passed through an aperture member having a plurality of holes to form multiple beams, each of which are blanking-controlled. Then, beams that have not been blocked are reduced in size by an optical system and projected onto a substrate placed on a movable stage.

In the multi-beam writing apparatus, which is capable of irradiating with a plurality of beams at a time, beams formed by passing through the same or different holes in the aperture member are combined (or stitched) together to write a desired pattern of graphic shapes. The shape of the entire image of multiple beams projected onto the substrate (which may hereinafter be referred to as "beam shape") represents the stitching accuracy of written graphics. In the writing apparatus, the beam shape may vary with time due to various factors. Such variation in beam shape leads to degradation of writing accuracy.

DETAILED DESCRIPTION

In one embodiment, a multi charged particle beam writing apparatus includes a shaping aperture array member including a plurality of holes and configured to form multiple beams by allowing a charged particle beam to pass through the plurality of holes, a blanking aperture array member including a plurality of blankers each configured to turn on and off a corresponding beam of the multiple beams, a movable stage holding a substrate thereon, the substrate being a writing target, a stage position detector detecting a position of the stage, a mark disposed on the stage, a deflector deflecting the multiple beams, a beam position detector detecting a beam position of each beam by allowing the multiple beams to pass over the mark, a beam shape detector detecting a beam shape of the multiple beams at predetermined time intervals based on the detected beam position and the detected position of the stage, the multiple beams being used to irradiate the substrate, and a writing data processor calculating an amount of irradiation correction of each beam for correcting the beam shape based on the detected beam shape.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
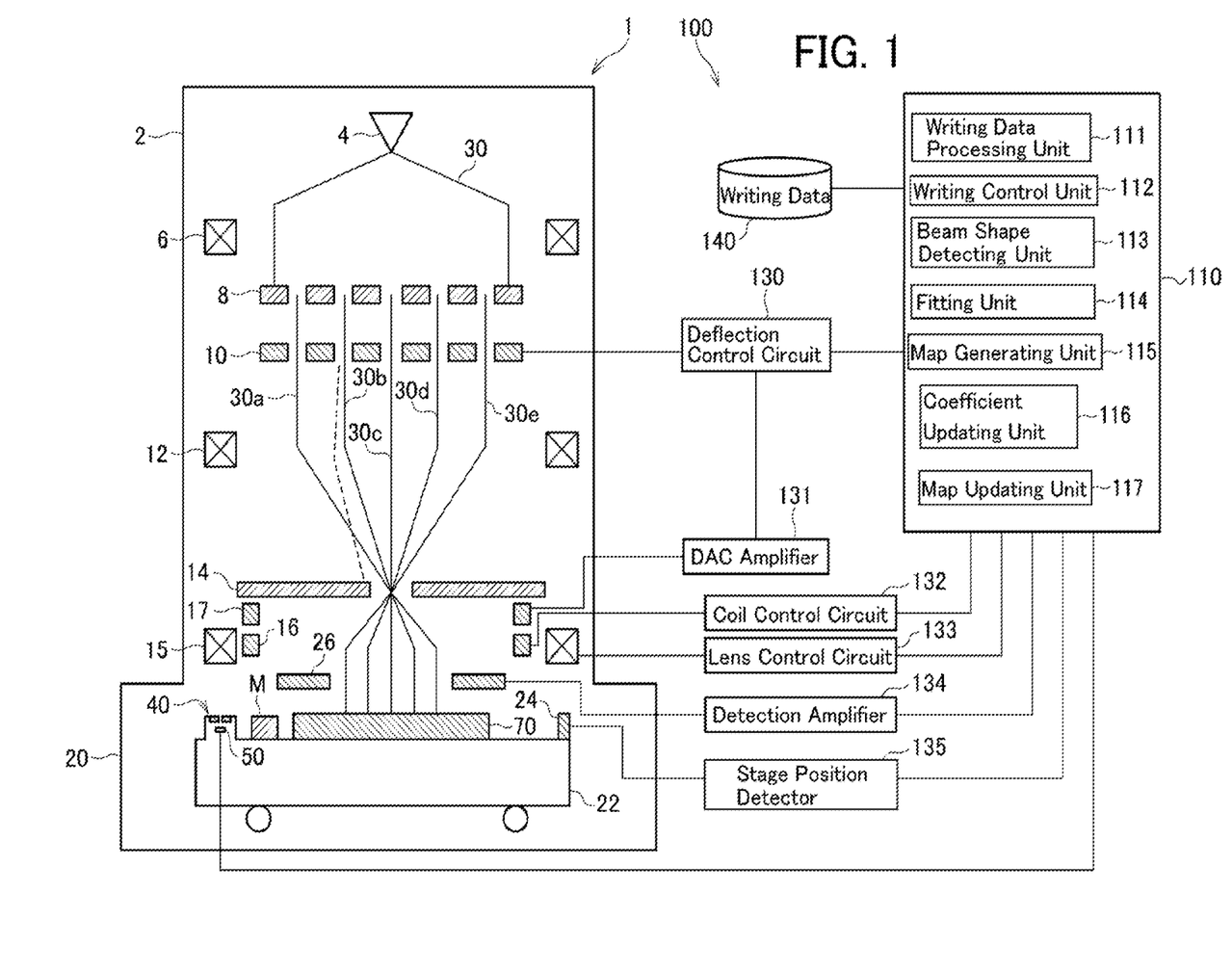
FIG. 1 is a schematic diagram of a multi charged particle beam writing apparatus according to an embodiment of the present invention.

FIG. 1 is a conceptual diagram illustrating a configuration of a writing apparatus according to the present embodiment. In FIG. 1, the writing apparatus includes a writer 1 and a controller 100. This writing apparatus is an exemplary multi charged particle beam writing apparatus. The writer 1 includes a column 2 and a writing chamber 20. The column 2 includes therein an electron gun 4, an illuminating lens 6, a shaping aperture array 8, a blanking aperture array 10, a reducing lens 12, a limiting aperture member 14, an objective lens 15, a coil 16, a main deflector 17 (deflector), and a sub-deflector (not shown).

The writing chamber 20 includes therein an XY stage 22 and a beam position detector 26. A substrate 70, which is a writing target, is placed on the XY stage 22. Examples of the substrate 70 include an exposure mask used in manufacturing semiconductor devices, and a semiconductor substrate (silicon wafer) on which semiconductor devices are manufactured. The substrate 70 may be a resist-coated mask blank on which nothing has yet been written.

Figure 11:
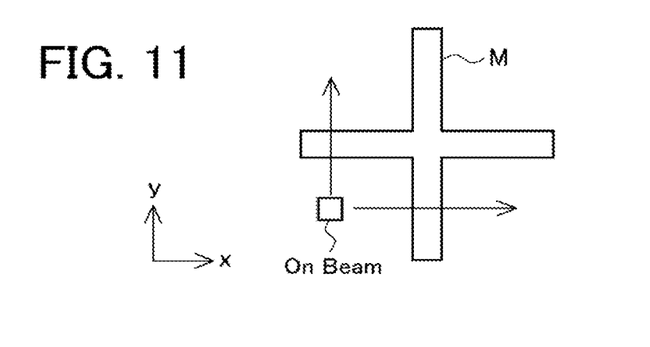
FIG. 11 is a plan view of a reflective mark.

A mirror 24 for detecting the position of the XY stage 22 is disposed on the XY stage 22. A reflective mark M for beam calibration is also on the XY stage 22. To facilitate position detection made by electron beam scanning, the reflective mark M has, for example, the shape of a cross (see FIG. 11). When the cross-shaped reflective mark M is scanned with an electron beam, the beam position detector 26 detects reflected electrons from the reflective mark M.

At a position outside the substrate 70, the XY stage 22 has a mark for position detection. The mark is not limited to a specific type, but, for example, a multi-beam inspection aperture member 40 (hereinafter referred to as "inspection aperture member 40"), which is a transmissive mark, may be used. The inspection aperture member 40 forms a multi-beam inspection device which includes a current detector 50. The height of the inspection aperture member 40 can be adjusted by an adjusting mechanism (not shown). The inspection aperture member 40 is preferably positioned at the same height level as the substrate 70.

The controller 100 includes a control computer 110, a deflection control circuit 130, a digital-to-analog converter (DAC) amplifier 131, a coil control circuit 132, a lens control circuit 133, a detection amplifier 134, a stage position detector 135, and a storage device 140, such as a magnetic disk device.

The deflection control circuit 130, the coil control circuit 132, the lens control circuit 133, the detection amplifier 134, the stage position detector 135, and the storage device 140 are connected via a bus to the control computer 110. Writing data is externally entered into and stored in the storage device 140.

The DAC amplifier 131 is connected to the deflection control circuit 130. The DAC amplifier 131 is connected to the main deflector 17. The coil 16 is connected to the coil control circuit 132. The objective lens 15 is connected to the lens control circuit 133.

The control computer 110 includes a writing data processing unit 111, a writing control unit 112, a beam shape detecting unit (a beam shape detector) 113, a fitting unit 114, a map generating unit 115, a coefficient updating unit 116, and a map updating unit 117. The functions of these units of the control computer 110 may be implemented either by hardware or software. When the functions of the units described above are configured by software, a program that implements at least some of the functions of the control computer 110 may be stored in a recording medium and read and executed by a computer including an electric circuit. The recording medium does not necessarily need to be a removable medium, such as a magnetic disk or an optical disk, and may be a fixed-type recording medium, such as a hard disk device or a memory.

Figure 2:
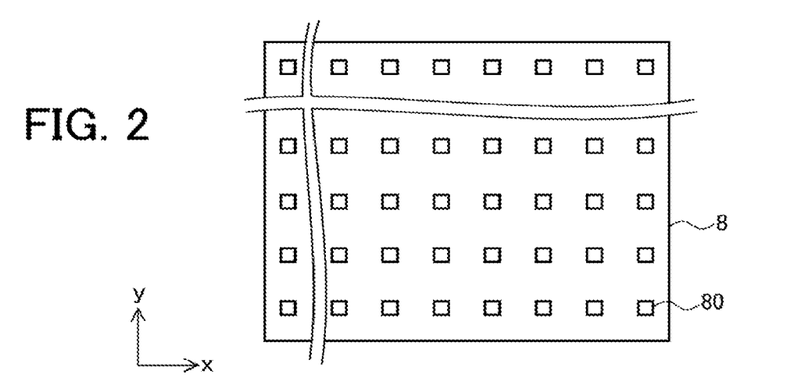
FIG. 2 is a schematic diagram of a shaping aperture array.

FIG. 2 is a conceptual diagram illustrating a configuration of the shaping aperture array 8. As illustrated in FIG. 2, the shaping aperture array 8 has holes (openings) 80 arranged in a matrix of m rows (in the y-direction) and n columns (in the x-direction) at a predetermined array pitch, where both m and n are greater than or equal to two (m, n≥2). The holes 80 are rectangular holes of the same shape and dimensions. The holes 80 may be circular holes of the same diameter.

An electron beam 30 emitted from the electron gun 4 substantially perpendicularly illuminates the entire shaping aperture array 8 through the illuminating lens 6. The electron beam 30 illuminates a region including all the holes 80 in the shaping aperture array 8. Part of the electron beam 30 passes through the plurality of holes 80 to form multiple beams 30a to 30e, such as those illustrated in FIG. 1.

The blanking aperture array 10 has pass holes (openings) arranged to correspond to the respective holes 80 in the shaping aperture array 8 illustrated in FIG. 2. The pass holes are each configured to allow a corresponding beam of the multiple beams to pass therethrough. Each pass hole has, in the vicinity thereof, blanking deflection electrodes (blanker or blanking deflector) for beam deflection.

The electron beams 30a to 30e passing through the pass holes are each independently deflected by a voltage applied thereto by the corresponding blanker. Blanking control is done by this deflection. Thus, a plurality of blankers each perform blanking deflection of a corresponding beam of the multiple beams exiting the holes 80 (openings) in the aperture member 8.

The multiple beams 30a to 30e passed through the blanking aperture array 10 are reduced in beam size and array pitch by the reducing lens 12, and directed toward a center hole formed in the limiting aperture member 14. Electron beams that have been deflected by the blankers of the blanking aperture array 10 shift their paths, deviate from the center hole in the limiting aperture member 14, and are blocked by the limiting aperture member 14. On the other hand, electron beams that have not been deflected by the blankers of the blanking aperture array 10 pass through the center hole in the limiting aperture member 14.

The limiting aperture member 14 blocks electron beams that have been deflected by the blankers of the blanking aperture array 10 in such a manner as to be turned off.

The electron beams 30a to 30e passed through the limiting aperture member 14 are aligned by the coil 16, brought into focus by the objective lens 15, and formed into a pattern image with a desired reduction ratio on the substrate 70. The electron beams (multiple beams) passed through the limiting aperture member 14 are deflected together in the same direction by the main deflector 17 and projected onto the substrate 70 at writing positions (irradiation positions).

During continuous movement of the XY stage 22, the beam writing positions (irradiation positions) are tracking-controlled by the main deflector 17 in such a manner that they follow the movement of the XY stage 22. The position of the XY stage 22 is detected using reflection of laser light emitted from the stage position detector 135 toward the mirror 24 on the XY stage 22.

Multiple beams applied at a time are ideally arranged at a pitch that is obtained by multiplying the array pitch of the holes 80 in the shaping aperture array 8 by the desired reduction ratio described above. When this writing apparatus performs a writing operation to write a desired pattern using a raster scanning technique, which involves sequential and continuous shot beam irradiation, beams that are required to produce the pattern are controlled to be turned on by blanking control.

The writing data processing unit 111 of the control computer 110 reads writing data from the storage device 140 and performs multiple stages of data conversion to generate shot data. The shot data defines whether to irradiate, for example, each of a plurality of beam-sized irradiation regions into which a writing surface of the substrate 70 is divided in the form of a lattice, and also defines the irradiation time.

On the basis of the shot data and the stage position information, the writing control unit 112 outputs a control signal to the deflection control circuit 130. On the basis of the control signal, the deflection control circuit 130 controls the voltage applied by each blanker of the blanking aperture array 10. Also, the deflection control circuit 130 computes data representing the amount of deflection (tracking deflection data) for deflecting beams in such a manner that the beams follow the movement of the XY stage 22. The tracking deflection data, which is a digital signal, is output to the DAC amplifier 131, by which the digital signal is converted to an analog signal, amplified, and applied as a tracking deflection voltage to the main deflector 17.

In this multi-beam writing apparatus, many beams arranged at a pitch obtained by multiplying the array pitch of the holes 80 in the shaping aperture array 8 by a predetermined reduction ratio are applied to the substrate 70 (writing target) at a time and combined together to fill in the beam pitches, and thus a desired pattern of graphic shapes is written. This requires, before and/or during writing, detection of beam positions, detection of the beam shape, and adjustment of dimensions.

The writing apparatus of the present embodiment uses the multi-beam inspection device to detect the beam shape.

Figure 3:
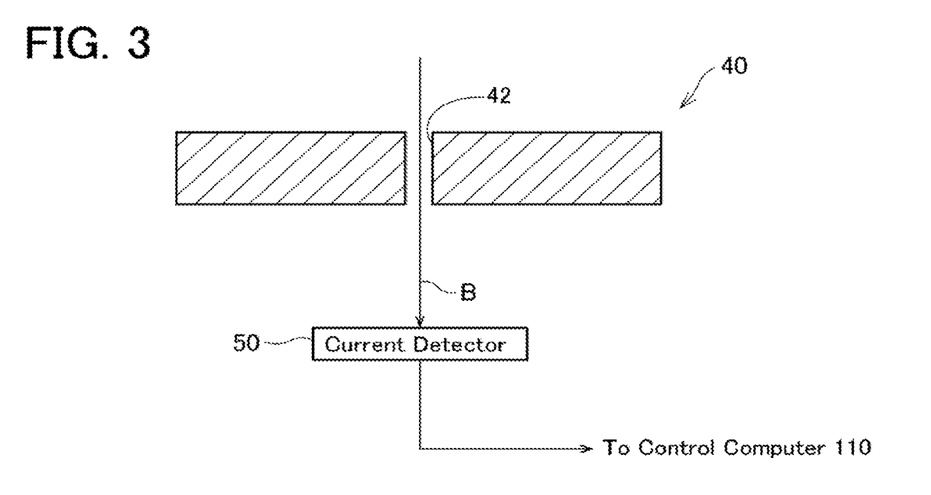
FIG. 3 is a cross-sectional view of a multi-beam inspection aperture member according to the embodiment.

FIG. 3 is a schematic diagram illustrating a configuration of the multi-beam inspection device. The inspection aperture member 40 is configured to allow only one electron beam to pass therethrough. The inspection aperture member 40 has, for example, a circular planar shape and is provided with a through hole 42 through which one beam passes along the central axis.

After passing through the through hole 42, an electron beam B enters the current detector 50, by which a beam current is detected. For example, a solid-state detector (SSD) may be used as the current detector 50. A result of the detection made by the current detector 50 is sent to the control computer 110.

The beam shape detecting unit 113 detects the beam shape by using the detected beam currents obtained by scanning the inspection aperture member 40 with multiple beams. A beam shape detecting method will now be described in detail along the flowchart of FIG. 4.

The blanking aperture array 10 is divided into a plurality of detection regions, and the inspection aperture member 40 is scanned with beams corresponding to each of the detection regions. In other words, the shaping aperture array 8 is divided into a plurality of detection regions, and beams passed through the holes 80 in the detection regions are turned on and used to scan the inspection aperture member 40.

Figure 4:
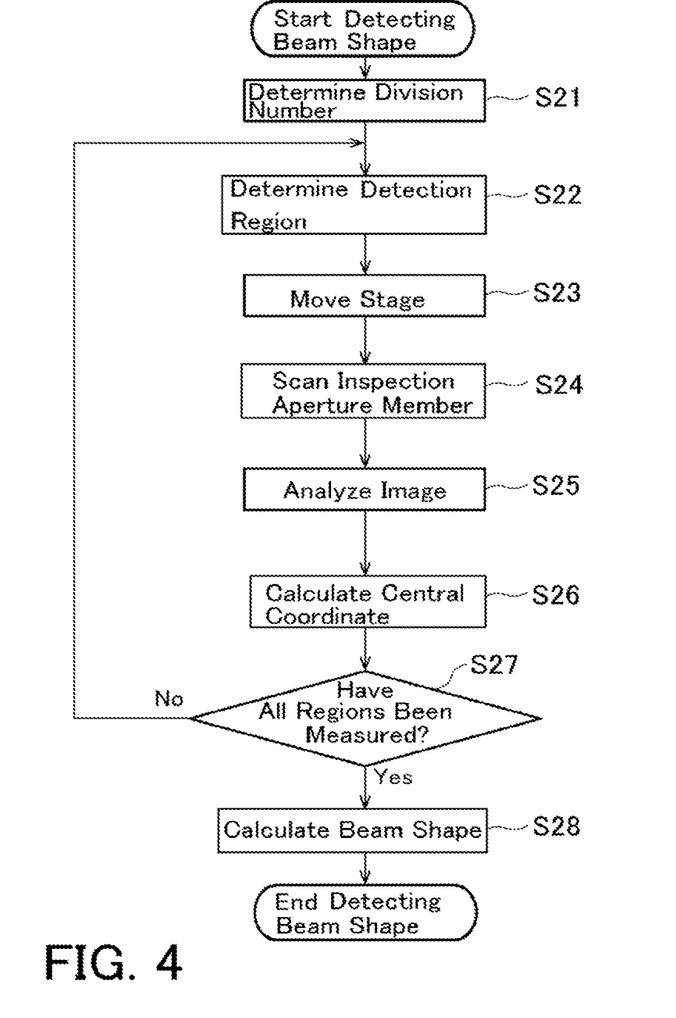
FIG. 4 is a flowchart illustrating a beam shape detecting method using the inspection aperture member.

The blanking aperture array 10 (shaping aperture array 8) is divided into a plurality of detection regions, because the maximum amount of deflection made by the main deflector 17 used for beam scanning is not large enough to cover the entire area of the blanking aperture array 10. Even if the amount of deflection is large enough to cover the entire area of the blanking aperture array 10, an increase in the amount of beam deflection results in changes in beam path, causes distortion of the beam shape, and leads to reduced accuracy in the detection of beam positions. It is thus preferable that the amount of deflection used for the detection be small enough not to cause distortion of the beam shape. Therefore, the number of regions "n" into which the blanking aperture array 10 is divided is determined first (where n is an integer greater than or equal to two) (step S21).

If the amount of deflection made by the main deflector 17 is large enough to cover the entire area of the blanking aperture array 10 and distortion of the beam shape caused by beam deflection is small enough not to affect detection accuracy, there is no need to carry out division into detection regions.

A region for which no detection has been made is selected and determined as a detection region (step S22). The XY stage 22 is moved and the inspection aperture member 40 is positioned directly below the beams corresponding to the detection region (step S23).

For example, a voltage applied by the blankers in the detection region is set to 0 V, whereas a voltage applied by the blankers in the other regions (non-detection regions) is set to 5 V. A plurality of beams turned on by the blankers in the detection region are deflected by the main deflector 17 in the XY direction and used to scan the inspection aperture member 40, so that the electron beams are sequentially allowed to pass through the through hole 42 (step S24). The current detector 50 detects each beam current.

Figure 5:
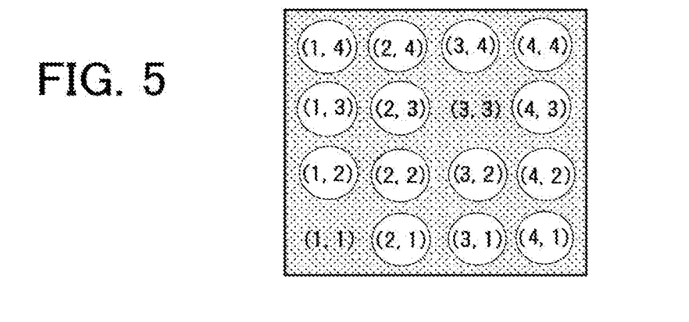
FIG. 5 illustrates an image obtained by beam scanning.

The control computer 110 converts the beam currents detected by the current detector 50 into luminance, generates a beam image on the basis of the amount of deflection made by the main deflector 17, and performs image analysis (step S25). For example, a beam image such as that illustrated in FIG. 5 is generated. This is an image of an exemplary inspection region, which is a four by four array with (1, 1) at the lower left corner. This image shows that there are beam losses at (1, 1) and (3, 3).

Figure 6:
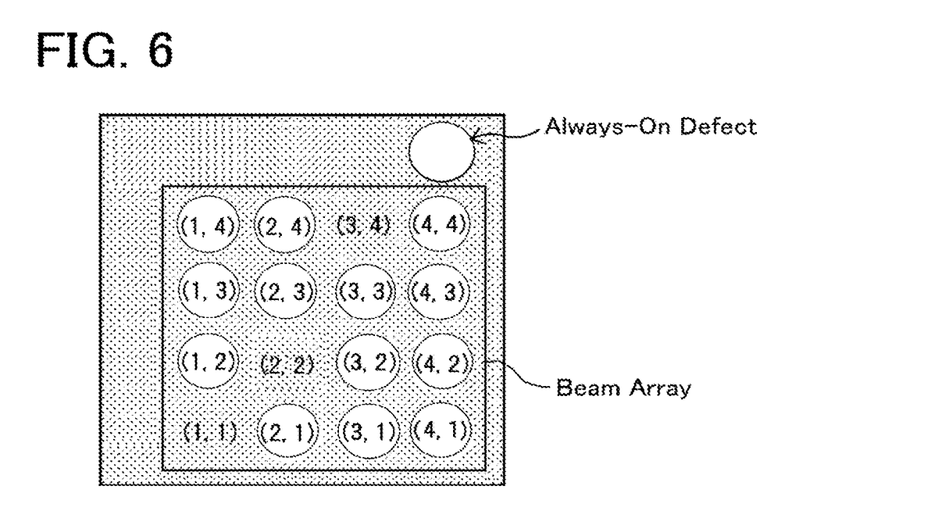
FIG. 6 illustrates an example of beam array recognition processing.

If there is a beam with an "always-on" defect in the vicinity of the detection region, an image such as that illustrated in FIG. 6 is obtained. The beam shape detecting unit 113 recognizes a beam array region corresponding to the detection region, and a defect outside the region is ignored. For example, since the detection region is determined to be a four by four array in advance, the beam shape detecting unit 113 recognizes the beam array in such a manner that the number of beams included in the region of the four by four array size is maximized.

The beam shape detecting unit 113 detects the position of each beam in the beam array region by using the stage position detected by the stage position detector 135. From the position of each beam, the beam shape detecting unit 113 calculates the central coordinates of the beam array corresponding to the detection region (step S26).

Figure 7:
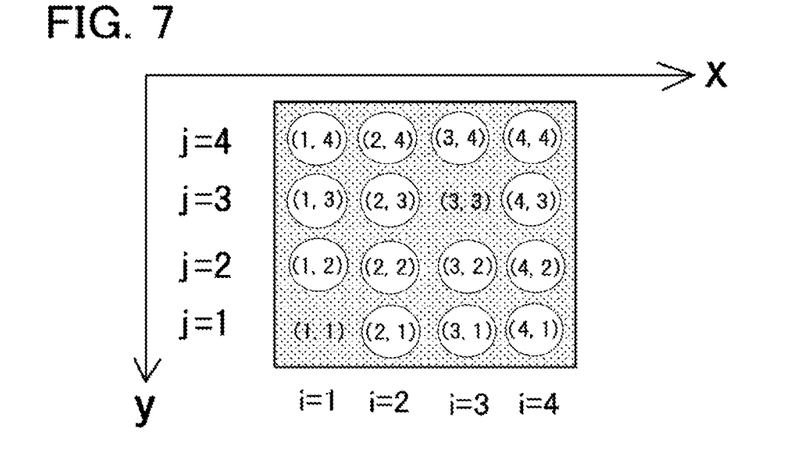
FIG. 7 illustrates how central coordinates of a beam array are determined.

For example, variables i and j are set as illustrated in FIG. 7, and the x and y coordinates of each beam are fitted to the following equations to determine coefficients $c_0$, $c_1$, $c_2$, $d_0$, $d_1$, and $d_2$. Since there are beam losses at (1, 1) and (3, 3) in the example illustrated in FIG. 7, the x and y coordinates of the other beams are fitted to the following equations:

$$x_i = c_0 + c_1 i + c_2 j$$

$$y_j = d_0 + d_1 i + d_2 j$$

After the coefficients $c_0$, $c_1$, $c_2$, $d_0$, $d_1$, and $d_2$ are determined, the central coordinates are calculated using these equations. In the example illustrated in FIG. 7, substituting i=2.5 and j=2.5 into the equations yields the central coordinates of the beam array. The equations described above may take into account not only the first order terms, but also the second and higher order terms.

The scanning of the inspection aperture member 40, image analysis, and calculation of the central coordinates of the beam array described above are performed for each of the "n" detection regions of the blanking aperture array 10 (steps S22 to S27).

Figure 8:
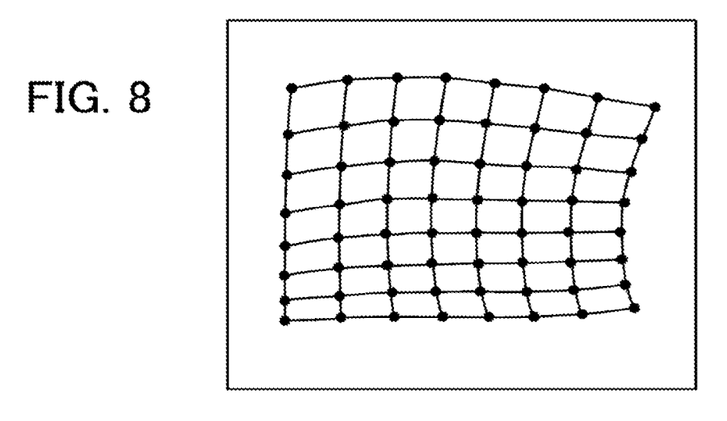
FIG. 8 illustrates a calculated beam shape.

After completion of detection for all the detection regions (Yes in step S27), the beam shape detecting unit 113 detects the beam shape on the basis of the central coordinates of the beam arrays corresponding to the respective detection regions (step S28). For example, the beam shape detecting unit 113 fits the central coordinates of the beam arrays corresponding to the "n" detection regions to a third-order polynomial to determine a polynomial representing the beam shape. Plotting this polynomial on a graph produces a beam shape, such as that shown in FIG. 8. FIG. 8 shows a beam shape produced in a visually easy-to-understand manner by plotting deviations from an ideal lattice that is set in a range of $-1 \leq x \leq 1$ and $-1 \leq y \leq 1$.

The fitting unit 114 performs fitting which involves approximating the detected beam shape with an equation. For example, the fitting unit 114 approximates the beam shape with the following approximate equations.

$$X = a_0 + a_1 x + a_2 y + a_3 x^2 + a_4 xy + a_5 y^2 a_6 x^3 + a_7 x^2 y + a_8 xy^2 + a_9 y^3 a_{10} x^4 + a_{11} x^3 y + a_{12} x^2 y^2 + a_{13} xy^3 a_{14} y^4$$

$$Y = b_0 + b_1 x + b_2 y + b_3 x^3 b_4 xy + b_5 y^2 + b_6 x^3 + b_7 x^2 y + b_8 xy^2 + b_9 y^3 + b_{10} x^4 + b_{11} x^3 y + b_{12} x^2 y^2 + b_{13} xy^3 + b_{14} y^4$$

The map generating unit 115 generates a map representing a fitting residue (i.e., difference between the beam shape and the approximate equation).

The writing data processing unit 111 calculates the amount of dose (irradiation) correction on the basis of the approximate equation of the beam shape and the map. The beam shape is corrected by performing writing using the corrected dose.

In the present embodiment, detection of the beam shape, fitting, and map generation are carried out at predetermined time intervals. Since beams are unstable immediately after the start of writing, the beam shape is initially detected at shorter intervals. Since beams become stable with time, the detection interval is gradually increased. This makes it possible to prevent degradation of writing throughput.

When a predetermined time period elapses after the previous beam shape detection and a new beam shape is detected, an approximate equation and a map are newly calculated on the basis of the new beam shape. If the approximate equation and the map that are referred to for the purpose of dose modulation are suddenly changed dramatically, the dimensions of the writing pattern may be considerably changed after the dose modulation.

Accordingly, in the present embodiment, the approximate equation and the map that are referred to for the purpose of dose modulation are preferably not suddenly changed dramatically, and are preferably updated in a stepwise manner on the basis of the interval of beam shape detection and the amount of change in approximate equation and map calculated from the detection result. The coefficient updating unit 116 updates a coefficient in the approximate equation stepwise at intervals shorter than those of beam shape detection. The map updating unit 117 updates the map stepwise at intervals shorter than those of beam shape detection.

Figure 9:
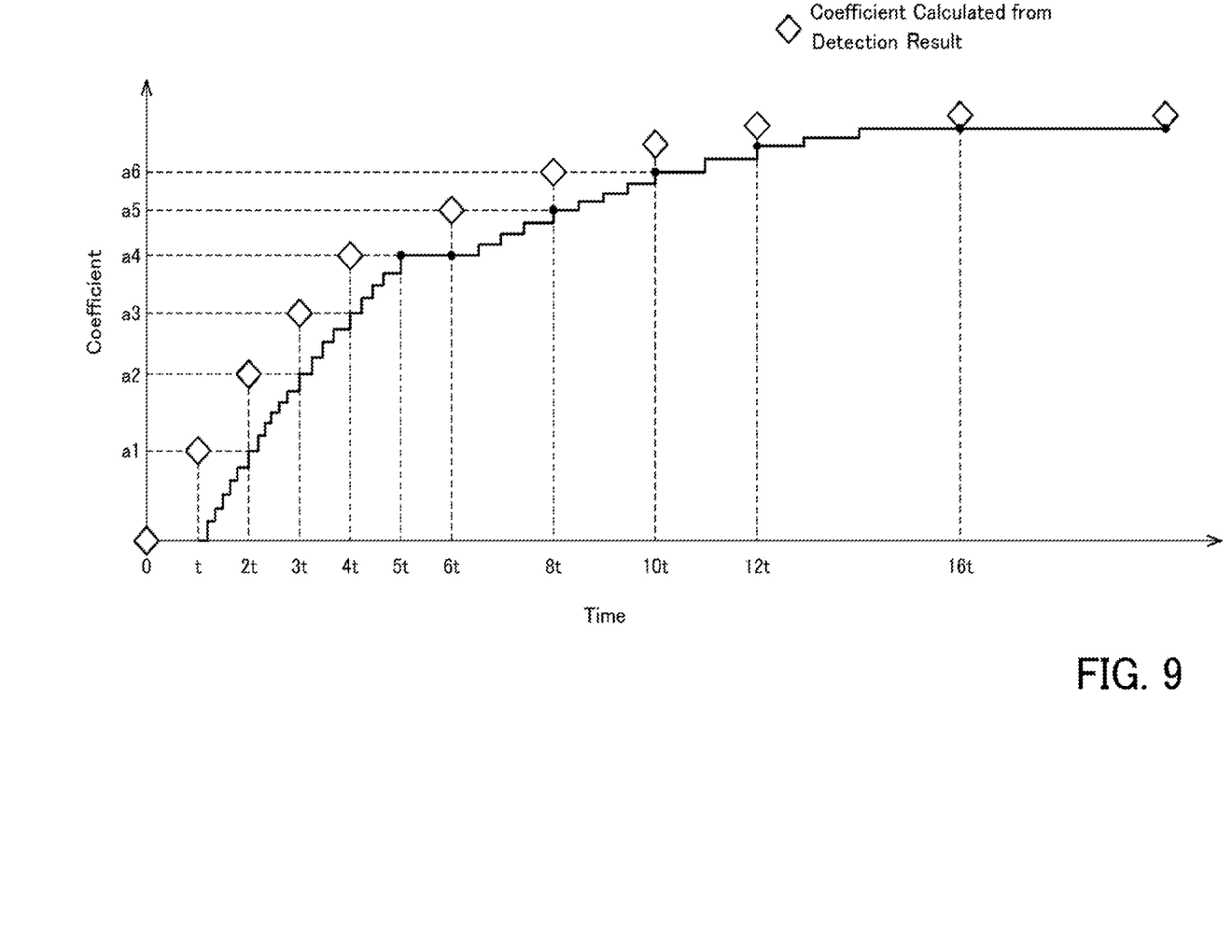
FIG. 9 is a graph showing an example of how a coefficient in an approximate equation is updated.

FIG. 9 is a graph showing an example of how a coefficient in an approximate equation is updated by the coefficient updating unit 116. FIG. 9 shows an example where the coefficient of one term in an approximate equation is updated. As shown in FIG. 9, when the coefficient calculated from the detection result at time t is a1, the coefficient updating unit 116 updates the coefficient stepwise in such a manner that the coefficient in the approximate equation referred to for the purpose of dose modulation is a1 at time 2t.

Similarly, when the coefficient calculated from the detection result at time 2t is a2, the coefficient updating unit 116 updates the coefficient stepwise in such a manner that the coefficient in the approximate equation referred to for the purpose of dose modulation is a2 at time 3t. Likewise, on the basis of the coefficient in the approximate equation calculated from the previous detection result, the coefficient in the approximate equation calculated from the current detection result, and the detection intervals, the coefficient updating unit 116 determines the amount of change in coefficient per unit time and gradually changes the coefficient.

Although the coefficient is updated stepwise six times in the period from time t to time 2t in the example shown in FIG. 9, the frequency of updates of the coefficient and the amount of change in coefficient in each update may be appropriately determined.

In the example shown in FIG. 9, after the detection at time 4t, the detection is performed at intervals of 2t; that is, the next detection is performed at time 6t. When the coefficient calculated from the detection result at time 4t is a4, the coefficient updating unit 116 updates the coefficient stepwise in such a manner that it is a4 at time 5t. After the coefficient reaches a4, that is, during the period from time 5t to time 6t, the coefficient is kept constant at a4.

Figure 10:
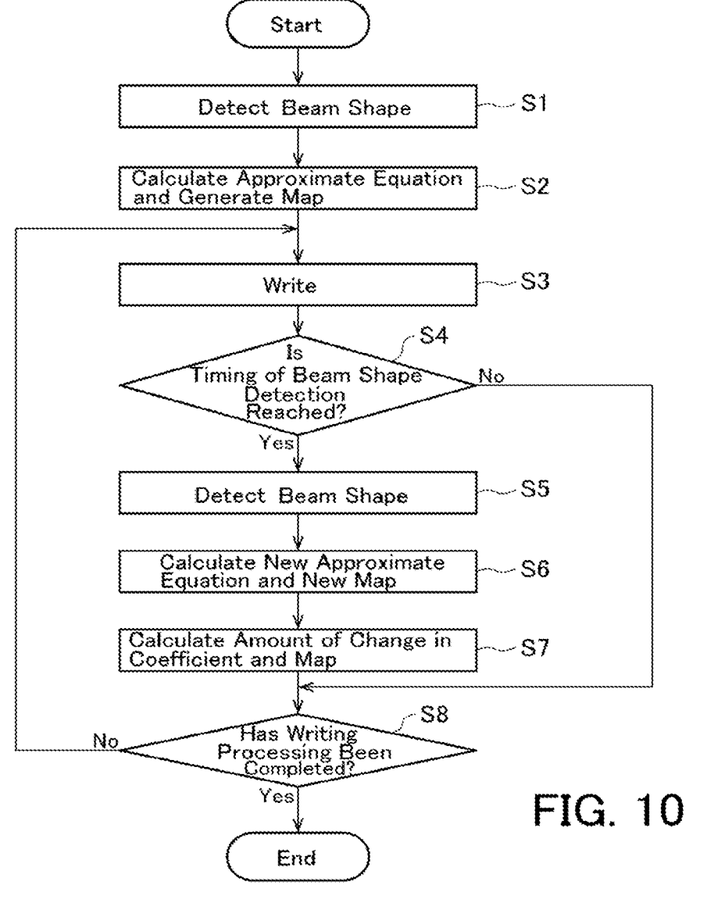
FIG. 10 is a flowchart illustrating a multi charged particle beam writing method according to the embodiment.

A multi charged particle beam writing method according to the present embodiment will now be described using the flowchart of FIG. 10.

Before pattern writing onto the substrate 70, the initial beam shape is detected using the multi-beam inspection device (step S1). On the basis of the detected beam shape, the fitting unit 114 calculates an approximate equation and the map generating unit 115 generates a map representing a fitting residue (step S2).

Then a pattern is written to the substrate 70 (step S3). After a predetermined time period elapses and the timing of beam shape detection is reached (Yes in step S4), the writing process is interrupted and the beam shape is detected (step S5). As described above, the interval of beam shape detection is gradually increased with time.

The fitting unit 114 and the map generating unit 115 calculate a new approximate equation and a new map, respectively, based on the current detection result (step S6).

On the basis of the approximate equation based on the previous detection result, the approximate equation based on the current detection result, and the length of time elapsed from the previous detection to the current detection, the coefficient updating unit 116 calculates the amount of change in coefficient in the approximate equation to be made before the next detection (step S7). At the same time, on the basis of the map based on the previous detection result, the map based on the current detection result, and the length of time elapsed from the previous detection to the current detection, the map updating unit 117 calculates the amount of change in map per unit time. Alternatively, the amount of change in approximate equation's coefficient and map per unit time may be determined and the coefficient and the map may be changed stepwise. In this case, in step S7, the intervals and frequencies of updates of the coefficient and the map, and the amount of change in coefficient and map per update, are determined.

If the writing process continues (No in step S8), the coefficient updating unit 116 changes the coefficient stepwise on the basis of the amount of change in coefficient per unit time calculated in step S7 and updates the approximate equation. Also, on the basis of the amount of change in map per unit time calculated in step S7, the map updating unit 117 updates the map stepwise.

The writing data processing unit 111 refers to the updated approximate equation and map, corrects (or modulates) the dose in such a manner as to correct the beam shape, and generates shot data. When the approximate equation and the map are updated stepwise, the dose changes stepwise. The writing control unit 112 controls the writer 1 using the shot data to perform writing (step S3).

As described above, in the present embodiment, by detecting and correcting the beam shape that changes with time, the degradation of writing accuracy can be prevented. Also, by updating, in a stepwise manner, the approximate equation of the beam shape and the map representing the fitting residue that are referred to for correcting the beam shape, and thereby preventing them from being suddenly changed dramatically, dimensional changes in writing pattern can be reduced.

By making the interval of beam shape detection variable and gradually longer, the impact on writing throughput can be reduced.

Although the embodiment described above has dealt with an example where the beam shape is detected using the multi-beam inspection device, the beam shape may be detected using the reflective mark M as a mark. Although the resulting accuracy is lower than when using the inspection aperture member, using the reflective mark makes it possible to quickly detect the beam position. The reflective mark M is, for example, in the shape of a cross, such as that illustrated in FIG. 11. The electron beam B is deflected back and forth and from side to side (i.e., in the x-direction and the y-direction) by the main deflector 17 to scan the cross-shaped reflective mark M. The reflected electrons are detected by the beam position detector 26, amplified by the detection amplifier 134, converted to digital data, and output as detection data to the control computer 110. The beam shape detecting unit 113 calculates the beam position on the basis of a profile (representing changes in the intensity of reflected electrons) in which detected reflected electrons are arranged in chronological order and the corresponding stage position.

Figure 12:
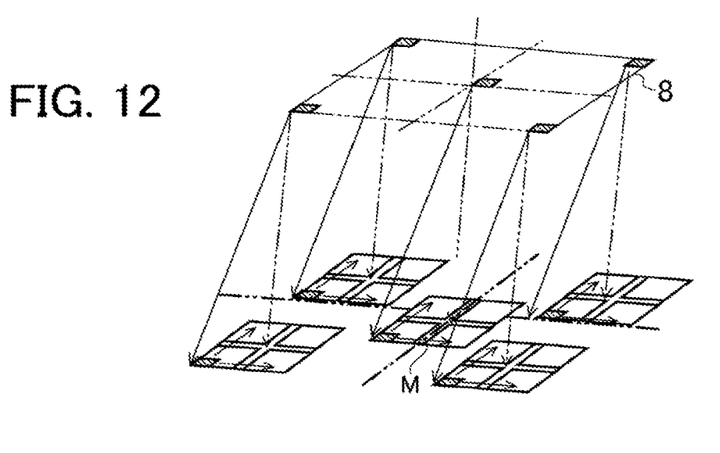
FIG. 12 illustrates how a beam shape is detected.

In the detection of the beam shape, only specific beams are turned on and the reflective marks M are moved to directly below the "on" beams on the basis of a designed beam size. Then, the cross-shaped reflective marks M are scanned to calculate the beam positions. For example, as illustrated in FIG. 12, a beam corresponding to the center of the shaping aperture array 8 and beams corresponding to the four corners of the shaping aperture array 8 are sequentially turned on, so as to calculate the positions of the respective beams and determine the beam shape in the same manner as in the embodiment described above.

The beam shape may be frequently detected using the reflective marks M immediately after the start of writing (i.e., when beams are unstable), and then when beams become stable, the beam shape may be detected with high accuracy using the multi-beam inspection device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    a shaping aperture array member including a plurality of holes and configured to form multiple beams by allowing a charged particle beam to pass through the plurality of holes;
    a blanking aperture array member including a plurality of blankers each configured to turn on and off a corresponding beam of the multiple beams;
    a movable stage holding a substrate thereon, the substrate being a writing target;
    a stage position detector detecting a position of the stage;
    a mark disposed on the stage;
    a deflector deflecting the multiple beams;
    a beam position detector detecting a beam position of each beam by allowing the multiple beams to pass over the mark;
    a beam shape detector detecting a beam shape of the multiple beams at predetermined time intervals based on the detected beam position and the detected position of the stage, the multiple beams being used to irradiate the substrate; and
    a writing data processor calculating an amount of irradiation correction of each beam for correcting the beam shape based on the detected beam shape.

2. The apparatus according to claim 1, further comprising:
    a fitting processor calculating an approximate equation that approximates the detected beam shape; and
    a map generator generating a map that represents a difference between the detected beam shape and the approximate equation,
    wherein the writing data processor calculates the amount of irradiation correction based on the approximate equation and map updated based on the detected beam shape.

3. The apparatus according to claim 2, further comprising:
    a coefficient updater updating, when a new approximate equation is calculated, a coefficient in the approximate equation stepwise; and
    a map updater updating, when a new map is generated, the map stepwise.

4. The apparatus according to claim 1, wherein the blanking aperture array member is divided into a plurality of detection regions; and
    the beam shape detector detects the beam shape from central coordinates of beam arrays corresponding to the respective detection regions.

5. The apparatus according to claim 1, wherein the predetermined time intervals are set to increase with time.

6. The apparatus according to claim 1, wherein the mark is a transmissive mark, and the beam position detector detects a current of a beam transmitted through the mark.

7. The apparatus according to claim 1, wherein the mark is a reflective mark, and the beam position detector detects charged particles reflected from the mark.

8. A charged particle beam writing method comprising:
    emitting a charged particle beam;
    forming multiple beams by allowing the charged particle beam to pass through a plurality of openings in an aperture member;
    performing blanking deflection involving turning on and off a corresponding beam of the multiple beams using a plurality of blankers;
    deflecting the blanking-deflected beams, using a deflector, to writing positions of the respective beams in such a manner that the beams follow movement of a stage capable of holding a substrate thereon;
    scanning a mark with the multiple beams at predetermined time intervals, the mark being disposed on the stage;
    detecting a position of each beam of the multiple beams by the scanning;
    detecting a beam shape of the multiple beams based on the detected position of each beam, the multiple beams being used to irradiate the substrate; and
    calculating an amount of irradiation correction of each beam for correcting the beam shape based on the detected beam shape.

9. The method according to claim 8, wherein an approximate equation that approximates the beam shape is calculated;
- a map that represents a difference between the beam shape and the approximate equation is generated; and
- the approximate equation and the map are updated based on the detected beam shape, and the amount of irradiation correction is calculated based on the updated approximate equation and map.

10. The method according to claim 9, wherein when a new approximate equation is calculated, a coefficient in the approximate equation is updated stepwise; and
- when a new map is generated, the map is updated stepwise.

11. The method according to claim 8, wherein the predetermined time intervals are set to increase with time.

12. The method according to claim 8, wherein the mark is a transmissive mark, and the position of each beam is detected from a current of the beam transmitted through the mark.

13. The method according to claim 8, wherein the mark is a reflective mark, and the position of each beam is detected from charged particles reflected from the mark.

* * * * *